United States Patent [19]
Kalfus

[11] 4,115,707
[45] Sep. 19, 1978

[54] CIRCUIT FOR SINGLE-LINE CONTROL OF GTO CONTROLLED RECTIFIER CONDUCTION

[75] Inventor: Martin Aaron Kalfus, Morganville, N.J.

[73] Assignee: RCA Corporation, New York, N.Y.

[21] Appl. No.: 783,223

[22] Filed: Mar. 31, 1977

[51] Int. Cl.² .................................... H03K 17/72
[52] U.S. Cl. .................. 307/252 C; 307/252 M; 307/273; 307/269
[58] Field of Search ............ 307/252 C, 252 M, 273, 307/269; 323/225 C

[56] References Cited
U.S. PATENT DOCUMENTS

| | | | |
|---|---|---|---|
| 3,928,775 | 12/1975 | Steigerwald | 307/252 M |
| 3,940,633 | 2/1976 | Steigerwald | 307/252 C |

*Primary Examiner*—John Zazworsky
*Attorney, Agent, or Firm*—H. Christoffersen; Allen LeRoy Limberg; John M. O'Meara

[57] ABSTRACT

A circuit for applying turn-on and turn-off signals to the gate electrode of a gate-turn-off (GTO) controlled rectifier, responsive to whether a control signal is or is not supplied via a single control-signal line. The control signal is amplified to apply one of the turn-off and turn-on signals, and a one-shot supplies the other of the turn-off and turn-on signals responsive to the cessation of the control signal.

5 Claims, 6 Drawing Figures

CIRCUIT FOR SINGLE-LINE CONTROL OF GTO CONTROLLED RECTIFIER CONDUCTION

The present invention relates to a control circuit for applying turn-on and turn-off signals to the gate electrode of a gate-turn-off (GTO) controlled rectifier and, more particularly, to such a control circuit as will supply each of said signals responsive to a unidirectional signal sent over a single control-signal line.

This particular class of GTO control circuits is favored for use in automobiles where the chassis provides a common electrical ground and single-wire electric control systems are customary. In addition, the present GTO control circuit has the advantage that it does not draw current in its inactive state.

The present invention is embodied in a control circuit wherein a control signal supplied via a single control-signal line is amplified and applied as one of the turn-on and turn-off signals to the GTO. The control circuit includes a one-shot to provide the other of the turn-on and turn-off signals to the GTO, responsive to the cessation of the control signal.

Figure 1:
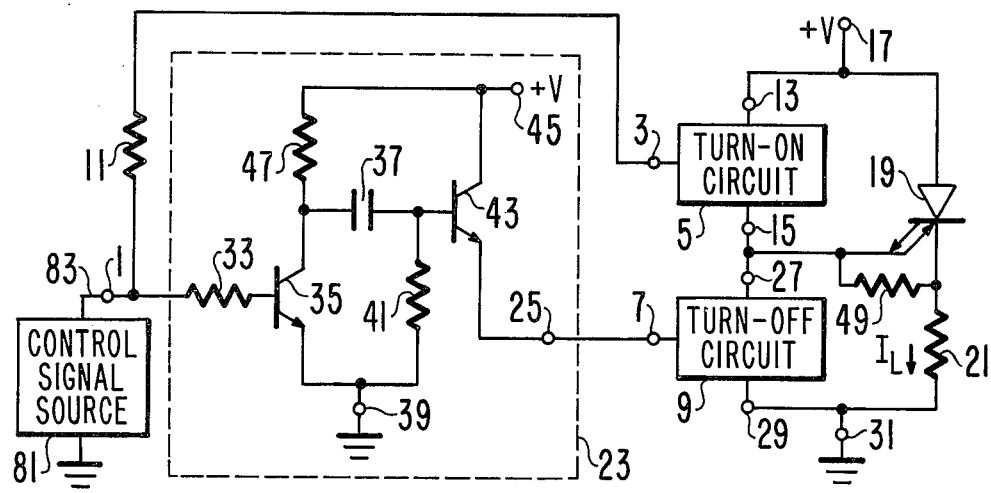
FIG. 1 is a schematic diagram partially in block form of the general configuration of GTO and control circuits in which the present invention is embodied.

In FIG. 1, the principal anode-to-cathode conduction path of GTO 19, when conductive, completes a connection between terminal 17 to which positive potential $+V$ is applied and terminal 31 to which a ground reference potential is applied. This connection includes a load with a direct current conductive path therethrough, shown as a resistor 21. Conduction between the anode and cathode of GTO 19 is triggered by application of positive direct current to its gate electrode and tends to be self-sustaining so long as current flows through its principle conduction path. Conduction can be interrupted, however, by withdrawing a sufficiently large positive current from its gate electrode. Once so interrupted, conduction between anode and cathode of GTO 19 is not resumed until re-application of positive gate current or the application of a sharp voltage transition between the cathode and anode.

Figure 2:
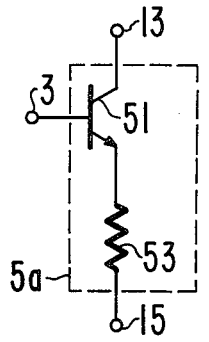
FIG. 2 is a schematic diagram of the form the turn-on circuit may take in the FIG. 1 circuit in certain embodiments of the invention.
Figure 3:
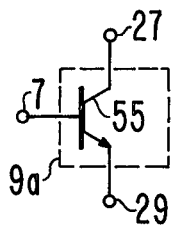
FIGS. 3, 4, 5 and 6 are schematic diagrams of different forms the turn-off circuit may take in the FIG. 1 circuit in certain embodiments of the invention.
Figure 4:
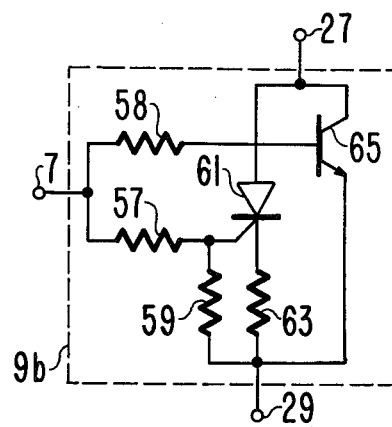
Figure 5:
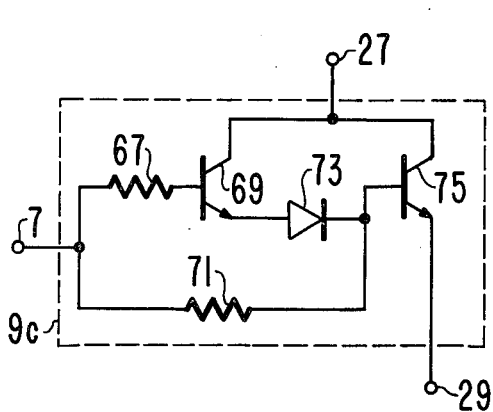
Figure 6:
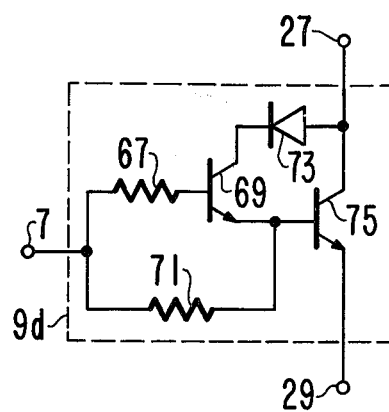

A turn-on circuit 5 supplies the positive current to the gate electrode of GTO 19 turning on GTO 19, by providing a conductive path between terminals 13 and 15 for the turn-on circuit to flow through, whenever positive current is applied to its control terminal 3. A turn-off circuit 19 withdraws positive current from the gate electrode of GTO 19, to turn GTO 19 off, by providing a conductive path between terminals 27 and 29 whenever positive current is applied to its control terminal 7. Turn-on circuit 5 may comprise, for example, a common-collector amplifier NPN transistor 51 and a current-limiting emitter resistor 53 as shown in FIG. 2. Turn-off circuit 7 may comprise, for example, a common-emitter amplifier transistor 55 as shown in FIG. 3. Other possible turn-off circuits are shown in FIGS. 4, 5 and 6. The turn-off circuit of FIG. 4 is described in detail in concurrently filed U.S. application Ser. No. 783,219 for "Switching Circuit", and the turn-off circuits of FIGS. 5 and 6 are described in detail in concurrently filed U.S. patent application Ser. No. 783,221 for "Transistor Switching Circuit".

In prior art circuits, the positive currents applied to control terminals 3 and 7 are supplied by separate control signal lines from separate control signal sources. In the FIG. 1 circuit, however, a single control signal source 81 supplies control signal over a single control signal line 83 to the input terminal 1 of a one-shot 23. When a positive polarity control signal is on the signal line 83 and applied to input terminal 1, this signal is applied via resistor 11 to input terminal 3 of turn-on circuit 5 for operating the turn-on circuit 5, as previously described. In response to this flow of current, GTO 19 turns on, as previously described, for supplying current to load 21 (illustrated as a cathode load, in this example). The load 21 may also be connected as an anode load for GTO 19.

Concurrent with the operation of the turn-on circuit 5, as previously described, the first control signal applied to input terminal 1 is also applied via resistor 33 to the base electrode of transistor 35 of one-shot 23. In response to the positive polarity control signal, transistor 35 is turned on for providing a low-impedance current path between its collector and emitter electrodes. Capacitor 37, previously charged, discharges through this low-impedance current path of transistor 35 to ground via terminal 39. As capacitor 37 so discharges, at a rate proportional to the value of resistor 41, the base electrode of transistor 43 is maintained at a low potential, keeping transistor 43 in a cut-off state.

When the control signal is removed from the signal line 83, that is from input terminal 1, the one-shot 23 responds to the trailing edge of the control signal, as will be described in detail later, for producing a positive polarity signal, which may be thought of as a second control signal at its output terminal 25. This second positive polarity control signal is applied to input terminal 7 of the turn-off circuit 9, for operating the turn-off circuit 9, as previously described, for connecting the gate electrode of GTO 19 to terminal 31 receiving a reference potential, in this example ground. Concurrent with the operation of the one-shot 23, the turn-on circuit 5 responds to the trailing edge of the first control signal by opening its current conduction path between terminals 13 and 15. Accordingly, operation of the turn-off circuit 9 as described, causes current to be conducted from the gate electrode of GTO 19 to ground, turning off GTO 19, which opens its current conduction path between its anode and cathode electrodes, preventing the further supply of current to load 21.

When transistor 35 turns-off, after the first control signal applied to terminal 1 is removed, the impedance between its collector and emitter electrodes substantially increases, opening the discharge current path provided for capacitor 37. Capacitor 37 will now be charged by current flowing from terminal 45 receiving a voltage $+V$, through the series circuit of resistor 47, capacitor 37, resistor 41, and terminal 39 to ground. The charging time constant is principally determined by the sum of the resistances of resistors 41 and 47 multiplied by the capacitance of capacitor 37. When capacitor 37 initially begins taking on charge, a relatively high-magnitude current will flow through resistor 41, causing a voltage drop across resistor 41 that produces a positive voltage at the base of transistor 43 sufficiently large to turn-on transistor 43. Transistor 43, in turning on, lowers the impedance between its collector and emitter electrodes, providing a low-impedance current path between terminal 45 and output terminal 25. This causes the operating voltage +V to be applied to input terminal 7 of the turn-off circuit 9, as the second positive polarity control signal.

The turn-off circuit 9 responds to this positive polarity signal for turning-off GTO 19, as previously described. To ensure turn-off of GTO 19 it is important that the voltage drop across the current conduction path of turn-off circuit 9 be of a relatively low value when the current drawn from the gate electrode of the GTO 19 reduces to a relatively low magnitude. When the turn-off circuit 9 is initially turned-on, as described, a relatively high-magnitude current is drawn from the gate of the GTO 19, for initiating the turn-off of the GTO. This turn-off current rapidly diminishes to a relatively low value. Accordingly, the turn-off circuit 9 must be capable of initially conducting a relatively high-magnitude current, and thereafter a relatively low-magnitude current with a relatively low voltage drop across its current conduction path between terminals 27 and 29, as previously mentioned.

The output signal so provided at terminal 25 of the one-shot 23 has a time period predetermined by the RC time constant in charging capacitor 37. As capacitor 37 begins charging towards some maximum value (+V in this example), the magnitude of current flowing through capacitor 37 and resistors 47 and 41 connected in series with this capacitor, will diminish exponentially in proportion to the increasing charge on capacitor 37. After a period of time equivalent to a number of time constants of the charging circuit for capacitor 37, the voltage across resistor 41 will decrease in value to below the level of voltage necessary for maintaining transistor 43 turned-on. Accordingly, transistor 43 will turn off, effectively opening its current conduction path by substantially increasing the impedance between its collector and emitter electrodes, thereby removing the positive polarity second control signal from output terminal 25. One-shot circuit 23 is now in its inactive state, with capacitor 37 fully charged, and its transistors 35 and 43 turned off. Also, in response to the removal of the second control signal from its input terminal 7, the turn-off circuit 9 is itself turned off. Accordingly, no current is being drawn by circuits 23, 5, 9, with the GTO 19 turned off.

Resistor 49 reduces the flow of leakage current between the gate electrode and cathode of GTO 19 to ensure its turning completely off within the time period of the second control signal produced by the one-shot circuit 23. Resistor 49 can be eliminated if the time period of the second control signal is made relatively long.

The turn-on circuit 5 can be provided, as shown in FIG. 2, by a transistor 51 and emitter resistor 53 selected as shown. Transistor 51 is responsive to a positive control signal at terminal 1, for turning on to lower the impedance between its collector-emitter electrodes, for turning-on the GTO 19, as previously described. Similarly, the turn-off circuit 9 can be provided by a single transistor 55, as shown in FIG. 3. Transistor 55 is responsive to the second positive control signal produced at output terminal 25 of the one-shot 23, for turning-on to turn-off GTO 19, as previously described. The turn-on and turn-off circuits 5a, 9a can be found in the prior art, but in the prior art the use of such turn-on and turn-off circuits 5a, 9a respectively, required that an individual external signal line be connected to each circuit, for selectively providing first and second control signals at different times for operating GTO 19, as previously mentioned. The present inventor recognized that by combining a one-shot 23 with the turn-off circuit 9 and turn-on circuit 5, in the manner shown and described, that the external signal line for providing a second control signal to the turn-off circuit 9 can be eliminated. He recognized that such a combination would permit the turn-on circuit 5 and turn-off circuit 9 to be operated via the application and then removal of a control signal of the proper polarity, for turning on and turning off a GTO.

In his concurrently filed application U.S. application Ser. No. 783,219 for "Switching Circuit", the present inventor recognized that it is presently relatively expensive to use a single transistor, such as 55, for turning off a GTO as described above. The use of a single transistor for so turning off a GTO is known in the prior art, but is uneconomical for use in many applications where high-magnitude load current must be conducted by the GTO. With his co-inventor, the present inventor found that a relatively inexpensive transistor 65 can be combined with a thyristor 61 to provide a composite switching circuit 9b, as shown in FIG. 4. Resistor 58 provides biasing for transistor 65, and resistors 57 and 59 provide biasing for the thyristor 61. Resistor 63 provides current limiting for the thyristor 61. With the circuit 9b of FIG. 4 applied for use as the turn-off circuit 9 of FIG. 1, when the one-shot 23 operates to provide its positive going output signal at terminal 25, the SCR 61 turns on to initially conduct a relatively high magnitude of current from the gate electrode of GTO 19 to ground, concurrent with transistor 65 turning on to conduct up to a predetermined maximum magnitude of current from the gate electrode of GTO 19 to ground, that is substantially lower than that initially conducted by the SCR 61. As this gate current reduces to less than the predetermined maximum magnitude of current for transistor 65, the SCR 61 turns off, and transistor 65 continues conducting to complete the turn-off of the GTO 19.

In certain applications, it is desirable to limit the magnitude of gate current drawn from the gate of a GTO, in turning off the GTO, to prevent damage to the GTO. In FIGS. 5 and 6, the switching circuits 9c and 9d provide limiting of the gate current drawn from the GTO 19. The turn-off circuits 9c and 9d are substantially identical, except for the placement of diode 73 as shown, which serves to prevent reverse beta operation of transistor 69. When the one-shot 23 is operated to provide a positive polarity output signal at its output terminal 25, as previously described, in response thereto, the transistors 69 and 75 coact as a Darlington pair for conducting current in a relatively high-magnitude current range up to the limited magnitude value. When the magnitude of the gate current from the GTO 19 reduces to a relatively low value, transistor 69 turns off, and transistor 75 continues conducting current in response to the output signal from one-shot 23 being connected to its base electrode via resistor 71, with a relatively low voltage drop across its collector-emitter electrode, to complete the turn-off of the GTO 19.

It should be noted that although NPN transistors are shown in this example, PNP transistors can be substituted therefor, and operating and signal voltage polarities changed, as required.

What is claimed is:

1. In a circuit for operating a gate-turn-off controlled rectifier having a gate electrode, including turn-on circuit means having an input terminal receptive of a first control signal, and responsive thereto for applying an operating voltage to and supplying current to said gate electrode for turning on said gate-turn-off controlled rectifier, and turn-off circuit means having an input terminal receptive of a second control signal of the same polarity as said first control signal, and responsive thereto for applying a reference potential to and conducting current from said gate electrode, for turning off said gate-turn-off controlled rectifier, the improvement comprising:
- a signal input terminal receptive of said first control signal;
- resistor means connected between said signal input terminal and the input terminal of said turn-on means; and
- one-shot circuit means connected between said signal input terminal and said turn-off means, responsive to the trailing edge of said first control signal, for producing and applying said second control signal to the input terminal of said turn-off circuit means for a predetermined period of time, thereby permitting said turn-on circuit means and turn-off circuit means to be operated via control signals on a single control line, instead of individual control lines, respectively.

2. The circuit of claim 1, wherein said means for producing said second control signal, includes:
- a first terminal for receiving an operating voltage;
- a second terminal for receiving a source of reference potential;
- charge storage means connected between said first and second terminals;
- first transistor means having a control electrode connected to said signal input terminal, responsive to the presence of said first control signal, for providing a current conduction path between said charge storage means and said second terminal, for discharging said charge storage means, and thereafter to the absence of said first control for opening its current conduction path, permitting said charge storage means to charge towards a level where the voltage thereacross approaches that across said first and second terminals; and
- second transistor means responsive to the charging of said charge storage means, for producing and applying said second control signal to said turn-off circuit means.

3. The circuit of claim 2, wherein said charge storage means includes:
- first and second resistor means having one end individually connected to said first and second terminals, respectively; and
- capacitor means connected between the other ends of said first and second resistor means.

4. The circuit of claim 3, wherein said first transistor means includes:
- a transistor having a base electrode serving as said control electrode, a collector electrode connected to the common connection of said capacitor means and first resistor means, and an emitter electrode connected to said second terminal.

5. The circuit of claim 3, wherein said second transistor means includes:
- an output terminal;
- a transistor having a control electrode connected to the common connection of said capacitor means and second resistor means, and a main current path connected between said first terminal and output terminal, said transistor being turned-on in response to the voltage produced across said second resistor means exceeding a predetermined level during the charging of said capacitor means, for lowering the impedance of its main current path, thereby applying a substantial portion of said operating voltage to said output terminal as said second control signal.

* * * * *